United States Patent [19]

Wake

[11] Patent Number: 5,338,953
[45] Date of Patent: Aug. 16, 1994

[54] ELECTRICALLY ERASABLE AND PROGRAMMABLE SEMICONDUCTOR MEMORY DEVICE WITH TRENCH MEMORY TRANSISTOR AND MANUFACTURING METHOD OF THE SAME

[75] Inventor: Setsuo Wake, Hyogo, Japan

[73] Assignee: Mitsubishi Denki Kabushiki Kaisha, Tokyo, Japan

[21] Appl. No.: 894,662

[22] Filed: Jun. 5, 1992

[30] Foreign Application Priority Data

Jun. 20, 1991 [JP] Japan .................................. 3-148567
Feb. 19, 1992 [JP] Japan .................................. 4-032027

[51] Int. Cl.⁵ .............................................. H01L 29/68
[52] U.S. Cl. ................................... 267/316; 257/321; 257/331
[58] Field of Search ................. 257/321, 322, 316, 331

[56] References Cited

U.S. PATENT DOCUMENTS

| | | |
|---|---|---|
| 4,796,228 | 1/1989 | Baglee . |
| 4,868,619 | 9/1989 | Mukherjee et al. . |
| 4,929,988 | 5/1990 | Yoshikawa ................. 257/316 |
| 4,972,371 | 11/1990 | Komori et al. ............. 257/322 |
| 5,045,490 | 9/1991 | Esquivel . |
| 5,180,680 | 1/1993 | Yang . |

FOREIGN PATENT DOCUMENTS

| | | |
|---|---|---|
| 61-256673 | 11/1986 | Japan .................. 257/316 |
| 63-46760 | 2/1988 | Japan . |
| 63-84166 | 4/1988 | Japan . |
| 63-102372 | 5/1988 | Japan . |
| 63-142680 | 6/1988 | Japan . |
| 63-285966 | 11/1988 | Japan .................. 257/321 |
| 1-150364 | 6/1989 | Japan . |
| 1-291470 | 11/1989 | Japan .................. 257/316 |

OTHER PUBLICATIONS

Yoshikawa et al., "A Reliable Profiled Lightly Doped Drain (PLD) Cell for High-Density Submicrometer EPROM's and Flash EEPROM's", *IEEE Transactions on Electron Devices*, vol. 37, No. 4, Apr. 1990, pp. 999-1005.

"An In-System Reprogrammable 32K X 8 CMOS Flash Memory", by Virgil N. Kynett et al., IEEE Journal of Solid-State Circuits, vol. 23, No. 5, Oct. 1988, pp. 1157-1163.

*Primary Examiner*—Jerome Jackson
*Assistant Examiner*—Courtney A. Bowars
*Attorney, Agent, or Firm*—Lowe, Price, LeBlanc & Becker

[57] ABSTRACT

A p-type silicon substrate 1 is provided with a trench 11. A second gate oxide film 4 is formed on a bottom wall 11a of the trench. The trench has a side wall 11b on which a first gate oxide film 9 is formed. A thickness of the second gate oxide film 4 is smaller than that of the first gate oxide film 9. A floating gate electrode 5 is formed on the second and first gate oxide films 4 and 9. At the vicinities of the opposite ends of the floating gate electrode 5, there are formed an n+-drain diffusion region 2 and n+-source diffusion region 3. A control gate electrode 7 is formed over the floating gate electrode 5 with an layer insulating film 6 interposed therebetween. In an electrically programmable and erasable semiconductor memory device (EEPROM) of a flash type, a writing efficiency is improved, a reliability is improved with respect to quality control, and dimensions of memory transistors are reduced.

7 Claims, 11 Drawing Sheets

ELECTRICALLY ERASABLE AND PROGRAMMABLE SEMICONDUCTOR MEMORY DEVICE WITH TRENCH MEMORY TRANSISTOR AND MANUFACTURING METHOD OF THE SAME

BACKGROUND OF THE INVENTION

1. Field of the Invention

The present invention generally relates to an electrically erasable and programmable non-volatile semiconductor memory device and a manufacturing method of the same, and particularly relates to an improved structure of a so-called flash memory (electrically erasable and programmable read only memory) allowing electrical batch erase of electric charges for written information and to an improved manufacturing method of the same.

2. Description of the Background Art

EEPROMs are memory devices having structure capable of free programming of data as well as electrical writing and erasing. U.S. Pat. No. 4,868,619 and "An In-System Reprogrammable 32 K×8 CMOS Flash Memory" by Virgil Niles Kynett, et al (IEEE Journal of Solid-State Circuits, Vol. 23, No. 5, October 1988) have disclosed a flash memory, i.e., an EEPROM formed of one transistor and allowing electrical batch erase of written information charges.

FIG. 19 is a block diagram showing a general construction of a flash memory. In the figure, the EEPROM includes a memory cell matrix including rows and columns, an X-address decoder 200, a Y-gate sense amplifier 300, a Y-address decoder 400, an address buffer 500, I/O (input/output) buffer 600 and a control logic 700. Memory cell matrix 100 includes a plurality of memory transistors arranged in rows and columns. The rows and columns of memory cell matrix 100 are selected by X-address decoder 200 and Y-gate sense amplifier 300 connected thereto. Y-gate sense amplifier 300 is connected to Y-address decoder 400 for applying information for selecting the columns. X-address decoder 200 and Y-address decoder 400 are connected to address buffer 500 which temporarily stores address information. Y-gate sense amplifier 300 is connected to I/O buffer 600 which temporarily stores I/O data. Address buffer 500 and I/O buffer 600 are connected to control logic 700 which controls an operation of the flash memory. Control logic 700 performs the control operation based on a chip enable signal, an output enable signal and a program signal.

FIG. 20 is an equivalent circuit diagram showing a general construction of memory cell matrix 100 shown in FIG. 19. In the figure, there are disposed word lines $WL_1, WL_2, \ldots, WL_i$ extending in a row direction and bit lines $BL_1, BL_2, \ldots, BL_i$ which extend in a column direction and intersect the word lines to form a matrix. Memory transistors $Q_{11}, Q_{12}, \ldots, Q_{ii}$ each having a floating gate are disposed at intersections between the word lines and the bit lines. Each memory transistor has a drain connected to the bit line and a control gate connected to the word line. Sources of the memory transistors are connected to source lines $S_1, S_2, \ldots$, respectively. The sources of the memory transistors belonging to the same row are mutually connected, as shown in the figure, and are also connected to source lines $S_1, S_2, \ldots$ located at the opposite sides thereof. The source lines of all the memory cells are connected to each other in order to allow batch erasing.

FIG. 21 is a partial cross section showing a sectional structure of one memory transistor forming a part of the flash memory described above. The EEPROM shown in FIG. 21 is called as a stack gate type EEPROM. FIG. 22 is a schematic plan view showing a plane layout of the stack gate type flash memory of the prior art. FIG. 23 is a partial cross section taken along line XXIII—XXIII in FIG. 22. Referring to these figures, the construction of the conventional flash memory will be described below.

Referring to FIGS. 21 and 23, a p-type silicon substrate 1 has a main surface on which n-type impurity regions, e.g., n+-drain diffusion regions 32 and n+-source diffusion regions 33 are formed with spaces therebetween. Control gate electrodes 37 and floating gate electrodes 35 are formed in regions between n+-drain diffusion regions 32 and n+-source diffusion regions 33 for forming channel regions. Floating gates electrode 35 are formed on silicon substrate 1 and a thin gate oxide film 34 having a thickness of about 100Å is formed therebetween. Control gate electrodes 37 are electrically isolated from floating gate electrodes 35 by layer insulating films 36 formed on the floating gate electrodes 35. Floating gate electrodes 35 and control gate electrodes 37 are formed of polysilicon layers. A thermally oxidized film 38 is formed by thermal oxidation of a surface of the polysilicon layers which form floating gate electrodes 35 and control gate electrodes 37. Floating gate electrodes 35 and control gate electrodes 37 are covered by a smooth coating film 12 formed of, e.g., an oxide film.

As shown in FIG. 22, control gate electrodes 37 are mutually connected to form the word lines extending in a lateral direction, i.e., row direction. Bit lines 13 are perpendicular to the word lines 37 and interconnect n+-drain diffusion regions 32 arranged in a longitudinal direction, i.e., column direction. Bit lines 13 electrically contact n+-drain diffusion regions 32 through drain contacts 15, respectively. As shown in FIG. 23, bit lines 13 are formed on smooth coating film 12. As shown in FIG. 22, each n+-source diffusion region 33 extends along word lines 37, and is formed in the region surrounded by word lines 37 and field oxide films 10. Each n+-drain diffusion region 32 is formed in a region surrounded by word lines 37 and field oxide films 10.

An operation of the flash memory thus constructed will be described below with reference to FIG. 21.

In a writing operation, a voltage $V_D$ of about 6–8 V is applied to n+-drain diffusion region 32 and a voltage $V_G$ of about 10–15 V is applied to control gate electrode 37. Applied voltages $V_D$ and $V_G$ cause an avalanche break-down phenomenon at the vicinities of n+-drain diffusion region 32 and gate oxide film 34. This generates electrons having high energies at the vicinities of the same. Some of these electrons are attracted to floating gate electrode 35, as shown by an arrow 1, by an electric field caused by voltage $V_G$ which is applied to control gate electrode 37. The electrons are accumulated in floating gate electrode 35 in this manner, so that a threshold voltage $V_{th}$ of the control gate transistor increases. The state in which threshold voltage $V_{th}$ increases above a predetermined value is called as a written state "0".

Then, in an erasing operation, a voltage $V_S$ of about 10–12 V is applied to n+-source diffusion region 33, and a ground potential is maintained in control gate electrode 37 and n+-drain diffusion region 33. Since an electric field caused by voltage $V_S$ is applied to n+-source diffusion region 33, the electrons in floating gate electrode 35 pass, as shown by an arrow 2, through thin gate oxide film 34 owing to a tunnel effect. In this manner, the electrons in the floating gate electrode 35 are extracted, so that threshold voltage $V_{th}$ of the control gate transistor decreases. A state in which threshold voltage $V_{th}$ is lower than the predetermined value is called as an erased state "1". Since the source regions of the memory transistors are mutually connected, as shogun in FIG. 20, this erasing operation causes batch erase for all the memory cells.

In a reading operation, a voltage $V_G$, of about 5 V is applied to control gate electrode 37, and a voltage $V_D$, of about 1-2 V is applied to n+-drain diffusion region 32. In this operation, the above mentioned states "1" and "0" are determined, based on the existence of the current flowing through the channel region of the control gate transistor, i.e., based on the actual state between the ON and OFF states of the control gate transistor.

In the stack gate type flash memory of the prior art, gate oxide film 34 is formed of the thin oxide film having the thickness of about 100Å for generating the tunnel effect. This is preferable for the erasing operation of the data, but unpreferably deteriorates a writing property or characteristic for the data in the writing operation. In the erasing operation, the tunnel effect generates only at the vicinity of n+-source diffusion region 33 and gate oxide film 34. However, gate oxide film 34 in the conventional EEPROM is entirely formed of the thin oxide film having the thickness of about 100Å. Therefore, it is necessary to form the thin oxide film, which requires high quality, over an excessively large area. These problems will be further detailed below.

In the writing operation of the memory transistor in the stack gate type EEPROM, voltage $V_G$ is applied to the control gate electrode 37. Voltage $V_G$ is divided into voltages $V_1$ and $V_2$ in accordance with capacities of capacitors $C_1$ and $C_2$. Capacitor $C_1$ is formed of control gate electrode 37, layer insulating film 36 and floating gate electrode 35. Capacitor $C_2$ is formed of floating gate electrode 35, gate oxide film 34 and silicon substrate 1. The writing efficiency is determined by divided voltage $V_2$ applied to capacitor $C_2$, because higher voltage $V_2$ promotes the avalanche break-down phenomenon generating between n+-source diffusion region 33 and n+-drain diffusion region 32, by which more electrons are implanted into floating gate electrode 35. In this operation, $V_2$ is given by a following equation.

$$V_2 = \frac{C_1}{C_1 + C_2} V_G = \frac{1}{1 + \frac{C_2}{C_1}} V_G \qquad \text{(equation 1)}$$

Therefore, capacitor $C_2$ having a smaller capacity is required to obtain larger voltage $V_2$. In the memory transistor of the conventional stack gate type EEPROM, however, reduction of the thickness of gate oxide film 34 increases the capacity of capacitor $C_2$, and thus deteriorates the writing property in the conventional construction of the memory transistor.

Meanwhile, in the erasing operation, high $V_S$ of 10 V or more is applied to n+-source diffusion region 33 so that the electrons are extracted from the floating gate electrode 35 owing to the tunnel effect as described above. The high electric field of about 10-12 MV/cm required for causing the tunnel effect is generated only at the vicinity of n+-source diffusion region 33 and gate oxide film 34. Therefore, gate oxide film 34 having the small thickness of about 100Å is not required at regions other than those at which the high electric field is generated. A critical standard of quality control is required in processes for forming the oxide film in order to excessively enlarge the regions in which the oxide film having a controlled thin film is formed.

In the conventional construction of the stack gate type EEPROM, floating gate electrode 35 and control gate electrode 37 occupy a predetermined plane area through which they overlap each other. Therefore, the region of each memory cell is determined by an area occupied by n+-drain diffusion region 32, n+-source diffusion region 33 and floating gate electrode 35. Consequently, as long as the construction of the memory transistor shown in FIG. 21 is employed, dimensions of the memory cell can be reduced to a restricted extent, and in practice, it is difficult to reduce the dimensions of the memory cell.

SUMMARY OF THE INVENTION

An object of the invention is to provide an electrically erasable and programmable semiconductor memory device having an improved writing efficiency.

Another object of the invention is to provide an electrically erasable and programmable semiconductor memory device having an improved reliability with respect to quality control.

Still another object of the invention is to provide an electrically erasable and programmable semiconductor memory device in which an area occupied by a memory transistor is reduced and thus dimensions of a memory cell are reduced.

Yet another object of the invention is to provide a manufacturing method of an electrically erasable and programmable semiconductor memory device having an improved writing efficiency.

A still further object of the invention is to provide a manufacturing method of an electrically erasable and programmable semiconductor memory device having an improved reliability with respect to quality control.

Yet a further object of the invention is to provide a manufacturing method of an electrically erasable and programmable semiconductor memory device in which dimensions of a memory cell are reduced.

A further object of the invention is to enable variation of thicknesses of insulating films under gate electrodes depending on positions, without employing a photolithography technique.

According to one aspect of the invention, an electrically erasable and programmable semiconductor memory device comprises a semiconductor substrate of a first conductivity type, a first gate electrode, a first impurity region of a second conductivity type, a second impurity region of a second conductivity type, and a second gate electrode. The semiconductor substrate has a main surface and also has a trench defined by side walls and a floor. The first gate electrode has a first (upper) portion and a second (lower) portion. The first portion is formed on the side wall of the trench, and a first insulating film having a first thickness is interposed therebetween. The second portion is formed on the floor of the trench with a second insulating film interposed therebetween. The second insulating film has a second thickness substantially smaller than the first thickness. The first impurity region is formed in the main surface of the semiconductor substrate adjacent to the side wall of the trench and the first portion of the first gate electrode. The second impurity region is formed in the floor of the trench, adjacent to the second portion of the first gate electrode. The second gate electrode is formed on the first gate electrode with a third insulating film interposed therebetween.

In a manufacturing method of an electrically erasable and programmable semiconductor memory device according to a second aspect of the invention, a trench having opposing lateral side walls and a floor is formed in a main surface of a semiconductor substrate of a first conductivity type. A first insulating film having a first thickness is formed on the side wall of the trench. A second insulating film having a second thickness smaller than the first thickness is formed on the floor of the trench. A first gate electrode is formed. The first gate electrode has a first portion on the first insulating film and a second portion on the second insulating film. A first impurity region of a second conductivity type is formed on the main surface of the semiconductor substrate adjacent to the side wall of the trench and adjacent to the first portion of the first gate electrode. A second impurity region of a second conductivity type is formed in the floor of the trench adjacent to the second portion of the first gate electrode. A third insulating film is formed on the first gate electrodes, and the second gate electrode is formed on the third insulating film.

According to the semiconductor memory device of the invention, the first insulating film formed on the side wall of the trench has the large thickness, and the second insulating film formed on the floor of the trench has the small thickness. The first gate electrode has the first portion formed on the thick first insulating film and the second portion formed on the thin second insulating film. The first and second impurity regions are formed adjacent to the first portion and the second portion of the first gate electrode, respectively. Therefore, an avalanche break-down phenomenon can be generated at the vicinities of the thick first insulating film and the first impurity region, and a tunnel effect can be generated at the vicinities of the thin second insulating film and the second impurity region. As described above, the insulating film formed under the first gate electrode includes the first portion and the second portion having the different thicknesses, and thus the thickness of the insulating film can be determined to be optimum for both the avalanche break-down phenomenon utilized in the writing operation and the tunnel effect utilized in the erasing operation.

Since the region for the thin gate insulating film formed under the first gate electrode is reduced, the standard for quality control in the process for forming the insulating film can be loosened. Therefore, the reliability with respect to the quality control can be improved.

Further, in the semiconductor memory device of the invention, the first and second gate electrodes which form the memory transistor can be disposed inside the trench. Therefore, the memory transistor occupies a smaller area on the main surface of the semiconductor substrate. This contributes to reduce the dimensions of the memory cell.

In the manufacturing method of the semiconductor memory device according to the invention, the insulating film under the first gate electrode is formed on the sidewall and floor of the trench. Therefore, a photolithography technique is not required, and an anisotropic etching technique can be used to form the thick insulating film on the side wall of the trench and to form the thin insulating film on the floor of the trench. As described above, the thickness of the insulating film under the first gate electrode can be varied depending on the positions, without patterning the insulating film. Thus, it is not required to perform the patterning of the insulating film with highly precise mask alignment. Therefore, an influence which may be caused by mask misalignment can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
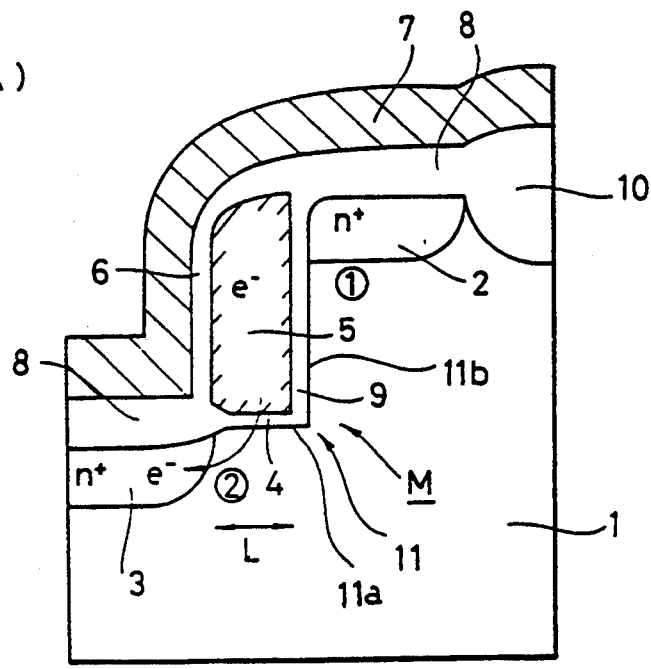
FIGS. 1A and B is a partial cross section showing a construction of one memory transistor in a flash memory according to an embodiment of the invention.

Referring to FIG. 1(A), a p-type silicon substrate 1 is provided with trenches 11 (only one is shown in this figure) having bottom walls 11a, on which thin second gate oxide films 4 having a thickness of about 100Å are formed. On a side wall 11b of each trench 11, there is formed a thick first gate oxide film 9 having a thickness of about 300Å. An n+-source diffusion region 3 is formed on bottom wall 11a of trench 11 adjacent to second gate oxide film 4. A thermally oxidized film 8 is formed on n+-source diffusion region 3. An n+-drain diffusion region 2 is formed on side wall 11b of trench 11 and a main surface of silicon substrate 1, and is located adjacent to first gate oxide film 9. Thermally oxidized film 8 is formed on n+-drain diffusion region 2. A floating gate electrode 5 is formed on second gate oxide film 4 and first gate oxide film 9. A layer insulating film 6 is formed on floating gate electrode 5. A control gate electrode 7 is formed over floating gate electrode 5 with layer insulating film 6 therebetween. Each memory transistor M thus constructed is isolated from the others by a field oxide film 10.

Figure 21:
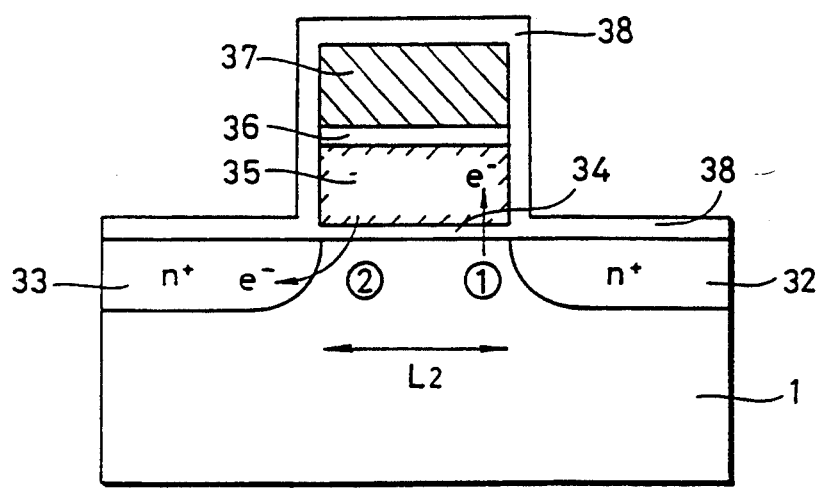
FIG. 21 is a partial cross section showing one memory transistor in a convention flash memory.
Figure 22:
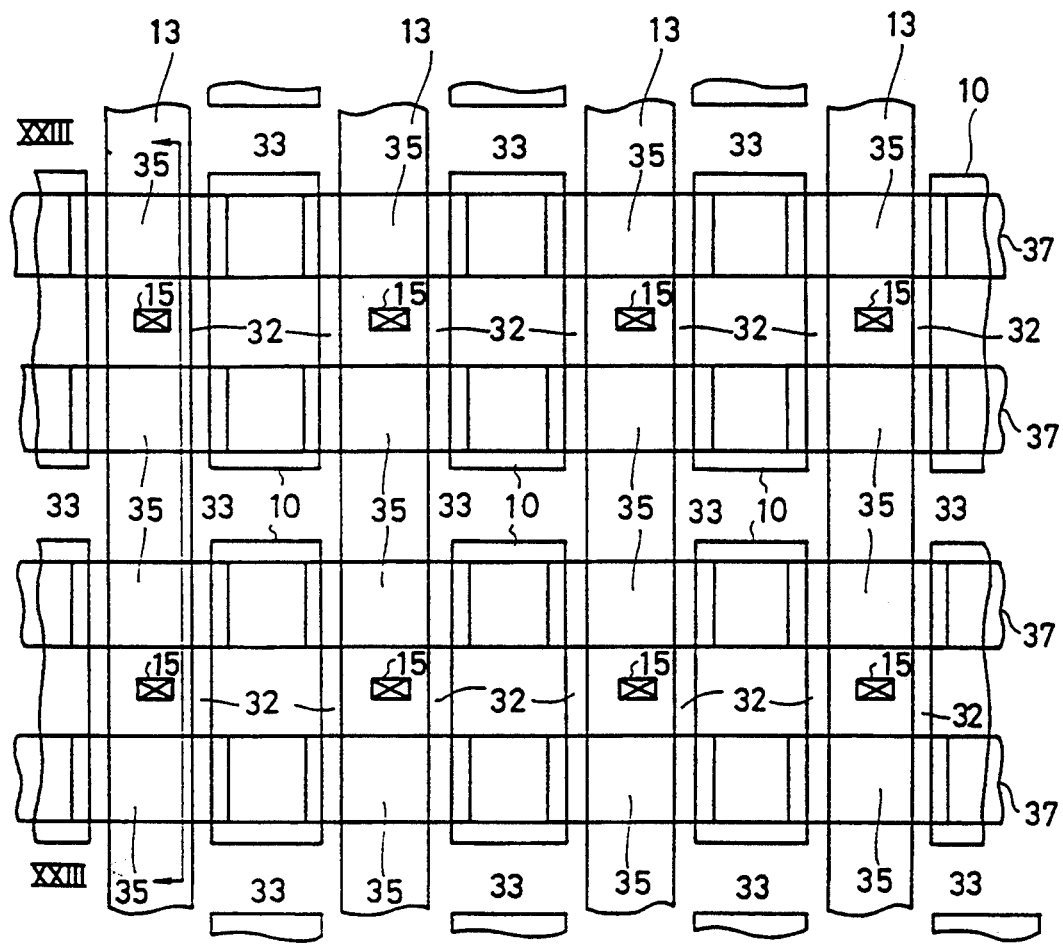
FIG. 22 is a partial plan view showing a plane layout of memory transistors in a conventional flash memory.
Figure 23:
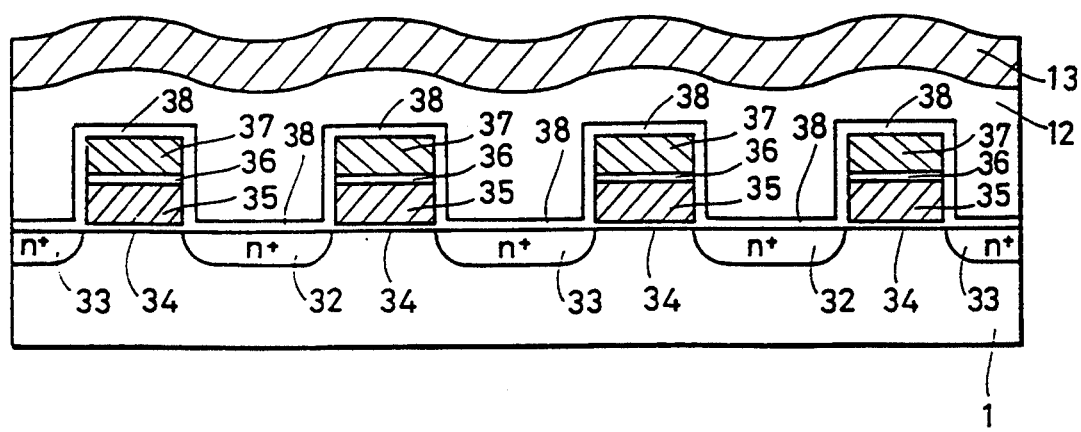
FIG. 23 is a partial cross section taken along line XXIII—XXIII in FIG. 22.

In memory transistor M of the invention, second gate oxide film 4 having the controlled small thickness is formed only on a portion of bottom wall 11a of trench 11. As shown in FIG. 1(A), assuming that $L_1$ is a length of bottom 11a of trench 11 on which second gate oxide film 4 is formed, and that W is a width (distance perpendicular to a sheet of the drawing) of the same, a tunnel oxide film forming second gate oxide film 4 is formed in an area represented by $L_1 \times W$. Meanwhile, in the conventional memory transistor shown in FIG. 21, gate oxide film 34 having the controlled small thickness is formed in an area represented by $L_2 \times W$. Therefore, according to the invention, the tunnel oxide film having the controlled small thickness is formed only in a partial region under floating gate electrode 5. Thus, the area for forming the tunnel oxide film is reduced from $L_2 \times W$ to $L_1 \times W$ ($L_1 < L_2$). Therefore, it is not necessary to form the thin oxide film, which requires high quality, in an excessively large region.

Figure 1B:
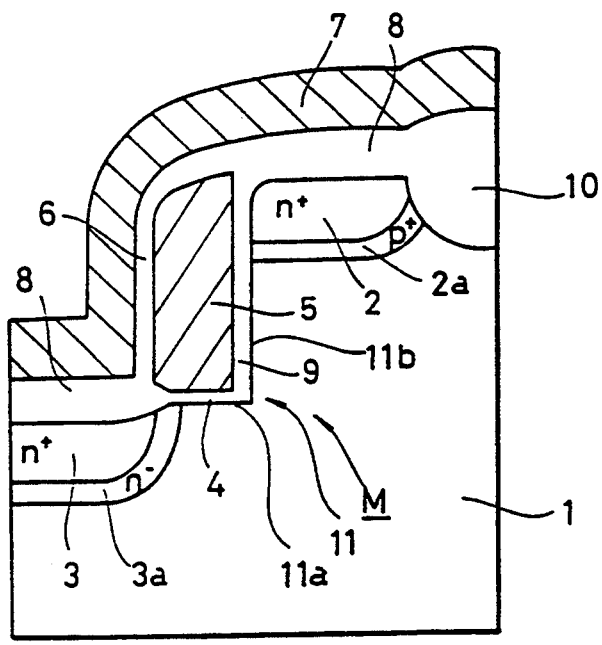

In the embodiment shown in FIG. 1(A), n+-drain diffusion region 2 and n+-source diffusion region 3 have a simple single structure. As shown in FIG. 1(B), a p+-buried layer 2a may be formed under n+-drain diffusion region 2, and n+-source diffusion region 3a may be formed under n+-source diffusion region 3. In addition to improvement of the writing efficiency obtained by the construction of the invention, these layer 2a and region 3a can improve the writing and erasing characteristics as well as reliability of the memory transistor.

That is, formation of p+-buried layer 2a outside (under) n+-drain diffusion region 2 by ion implantation makes steeper the concentration gradient between n+-drain diffusion region 2 and p-type silicon substrate 1. Therefore, an avalanche break-down phenomenon can be generated in the vicinity of n+-drain diffusion region 2 with a lower voltage. Accordingly, the writing efficiency can be further improved.

Also, with reduction in the size of the gate electrode, the source-drain breakdown voltage of the memory transistor has been lowered. Therefore, even if a voltage is applied to the source region at the time of erasing, a current flows between the source and the drain due to a punch-through phenomenon. As a result, the potential on the source region is decreased, reducing the erasing efficiency. In order to cope with this phenomenon, the concentration gradient between the source and the substrate is made lower by forming n−-diffusion region 3a only in the source region as shown in FIG. 1 (B). The breakdown voltage between the source and drain is thereby increased, making it possible for a high voltage to be applied to the source region. As a result, the erasing efficiency can be improved. The n− diffusion region is only formed in the source region because an adverse effect to the effect achieved by the p+-buried layer above is caused if the n− diffusion region is formed in the drain region.

Figure 2:
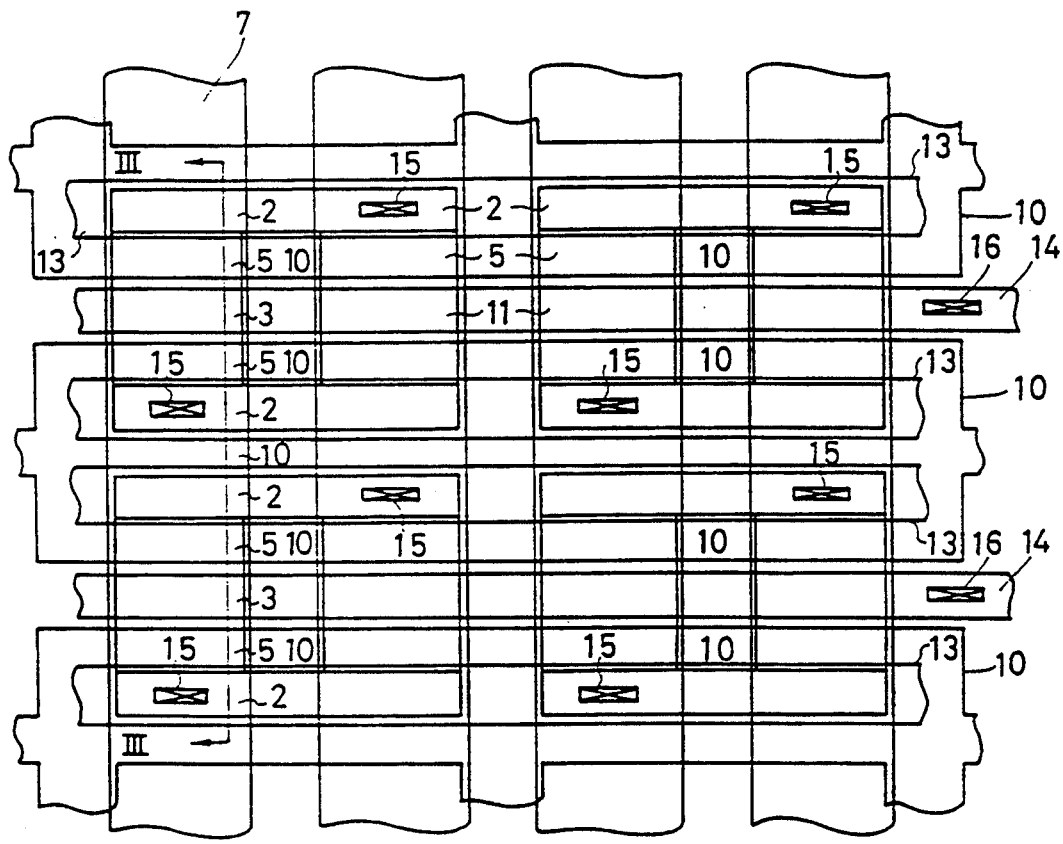
FIG. 2 is a partial plan view showing a plane layout of memory transistors in a flash memory according to an embodiment of the invention.
Figure 3:
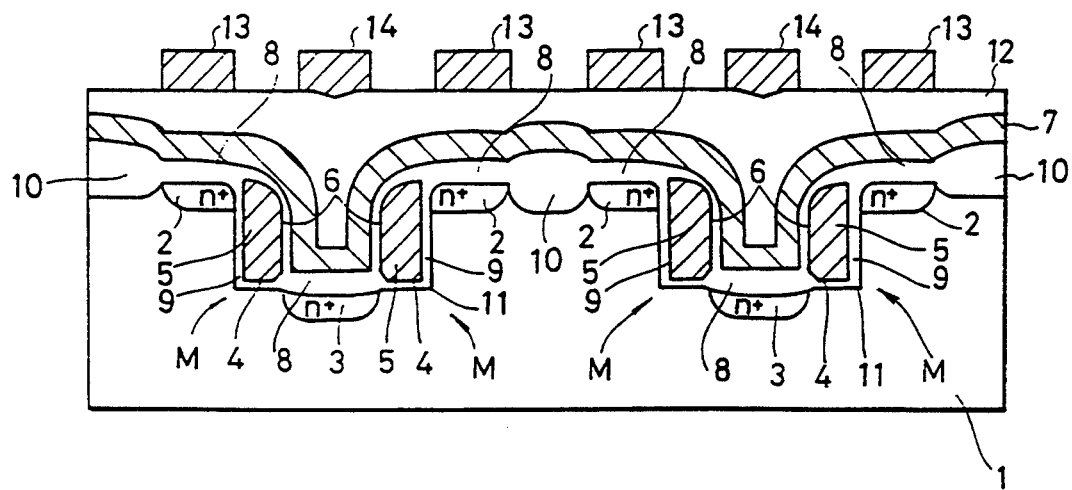
FIG. 3 is a partial cross section taken along line III—III in FIG. 2.

Referring to FIG. 2, control gate electrodes 7 are mutually connected in a row direction (longitudinal direction in the figure) to form word lines. N+-drain diffusion regions 2 aligned in a column direction (lateral direction in the figure) are connected to bit lines 13 through drain contacts 15. N+ source diffusion regions 3 extend in the column direction (lateral direction in the figure), and are connected to source lines 14 through source contacts 16. Referring to FIG. 3, n+-drain diffusion regions 2 adjacent in the row direction are isolated from each other by field oxide films 10, so that each set of memory transistors M which commonly use n+-source diffusion region 3 are electrically separated from other sets of memory transistors M.

As shown in FIG. 3, bit lines 13 and source lines 14 are formed on control gate electrode 7 with a smooth coating film 12 therebetween. Bit lines 13 and source lines 14 are alternately disposed with predetermined spaces therebetween. A pair of memory transistors M is formed in each trench 11. Memory transistor M includes floating gate electrode 5, control gate electrode 7, n+-drain diffusion region 2 and n+-source diffusion region 3. In each trench 11, control gate electrode 7 and n+-source diffusion region 3 are commonly used by two memory transistors M.

Now, an operation of the flash memory of the invention will be described below with reference to FIG. 1.

In a writing operation, a voltage $V_D$ of about 6–8 V is applied to n+-drain diffusion region 2 and a voltage $V_G$ of about 10–15 V is applied to control gate electrode 7. Applied voltages $V_D$ and $V_G$ cause an avalanche breakdown phenomenon at the vicinities of n+-drain diffusion region 2 and first gate oxide film 9, so that electrons having high energies are generated at the vicinities of the same. Some of these electrons are attracted to floating gate electrode 5 by an electric field caused by voltage $V_G$. This phenomenon is indicated by an arrow 1 in FIG. 1(A). The electrons are accumulated in floating gate electrode 5 in this manner, so that a threshold voltage $V_{th}$ of the control gate transistor increases. The state in which threshold voltage $V_{th}$ increases above a predetermined value is called as a written state "0".

Figure 20:
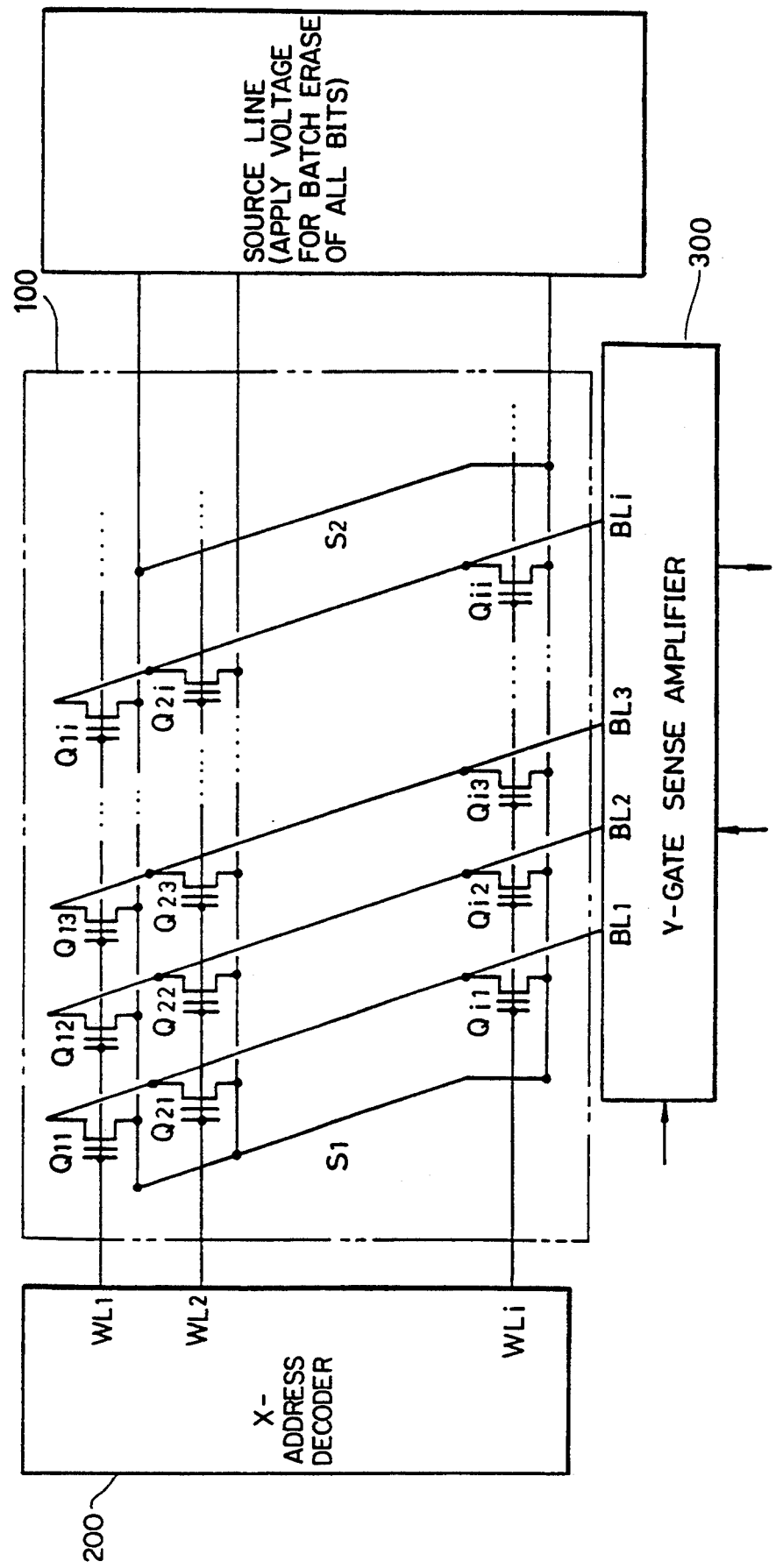
FIG. 20 is an equivalent circuit diagram showing a general construction of a memory cell matrix 100 shown in FIG. 19.

Then, in an erasing operation, a voltage $V_S$ of about 10–12 V is applied to n+-source diffusion region 3, and a ground potential is maintained in control gate electrode 7 and n+-drain diffusion region 3. Owing to an electric field generated by voltage $V_S$ and a resultant tunnel effect, the electrons in floating gate electrode 5 pass through thin gate oxide film 4. This phenomenon is indicated by an arrow 2 in FIG. 1(A). In this manner, the electrons in the floating gate electrode 5 are extracted, so that threshold voltage $V_{th}$ of the control gate transistor decreases. A state in which threshold voltage $V_{th}$ is lower than the predetermined value is called as an erased state "1". Since the source regions of the memory transistors are mutually connected, as shown in FIG. 20, the erasing operation described above causes batch erase.

In a reading operation, a voltage $V_G$, of about 5 V is applied to control gate electrode 7, and a voltage $V_D$, of about 1-2 V is applied to n+-drain diffusion region 2. In this operation, the above mentioned states "1" and "0" are determined, based on the existence of the current flowing through the channel region of the control gate transistor.

Among the above operations, the erasing operation is performed by the tunnel effect carried out through second gate oxide film 4 having the small thickness, and the writing operation is performed by implantation of the electrons owing to the avalanche phenomenon carried out through first gate oxide film 9 having the large thickness. In this manner, gate oxide films, which have the different thicknesses and are formed under the floating gate electrode 5, are selectively utilized depending on the phenomena utilized in the erasing and writing operations. Therefore, the writing efficiency is not deteriorated.

That is, in the writing operation, voltage $V_G$ is applied to control gate electrode 7. Voltage $V_G$ is divided into voltages $V_1$, $V_2$ in accordance with the capacities of a capacitor $C_1$ including control gate electrode 7, layer insulating film 6 and floating gate electrode 5 and a capacitor $C_2$ including floating gate electrode 5, first gate oxide film 9 and silicon substrate 1, respectively. In this case, the writing efficiency is determined by the divided voltage $V_2$ applied to capacitor $C_2$. That is, the higher voltage $V_2$ is, the easier it is for electrons to be implanted into floating gate electrode 5 by the avalanche phenomenon generated between n+-source diffusion region 3 and n+-drain diffusion region 2. In this case, $V_2$ is represented by the following equation (equation 1):

$$V_2 = \frac{C_1}{C_1 + C_2} V_G = \frac{1}{1 + \frac{C_2}{C_1}} V_G$$

Therefore, it is necessary to have a smaller capacity of capacitor $C_2$ to obtain a larger voltage $V_2$. In the memory transistor in accordance with the present invention, the thickness of first gate oxide film 9 is larger than that of second gate oxide film 4. Accordingly, the capacity of capacitor $C_2$ is smaller than that of the conventional memory transistor. Therefore, in the structure of the memory transistor according to the present invention, the writing efficiency can be improved compared with the conventional memory transistor.

In the erasing operation, high voltage $V_S$ is applied to n+-source diffusion region 3. At this time, electrons in floating gate electrode 5 are extracted by the electric field of voltage $V_S$ due to the tunnel effect. Generation of the tunnel effect is limited to a region in the vicinity of n+-source diffusion region 3. Therefore, in the memory transistor according to the present invention, only the gate oxide film in the region where the tunnel effect is caused, i.e., second gate oxide film 4 has a small thickness.

The minimum of the thickness of second gate oxide film 4 is limited by the tolerance to an applied electric field, and is in the order of 80Å. The maximum of the thickness of second gate oxide film 4 is limited by an applied voltage required to cause the tunnel effect and is in the order of 120Å in light of a practical applied voltage.

It is difficult to limit the range of the thickness of first gate oxide film 9 by a specific physical limitation. The thickness of first gate oxide film 9 may be as large as possible in order to obtain a highest possible potential caused at floating gate electrode 5 in applying a writing voltage to control gate electrode 7. The first gate oxide film may preferably be thinner to increase the driving current of the memory transistor.

In light of the facts described above, the available thicknesses of first gate oxide film 9 and second gate oxide film 4 are in the ranges of 150 to 300Å and 80 to 120Å, respectively. Preferably, the thickness of first gate oxide film 9 is in the range of 180 to 250Å and the thickness of second gate oxide film 4 is in the range of 90 to 110Å. Most preferably, the thicknesses of first gate oxide film 9 and second gate oxide film 4 are in the order of 200Å and 100Å, respectively.

Now, a manufacturing method of the flash memory according to the embodiment of the invention will be described below. FIGS. 4-8 are partial plan views showing plane layouts in various steps for manufacturing the EEPROM of the invention. FIGS. 9-18 are partial sectional views showing sectional constructions in respective steps for manufacturing the EEPROM of the invention.

Figure 4:
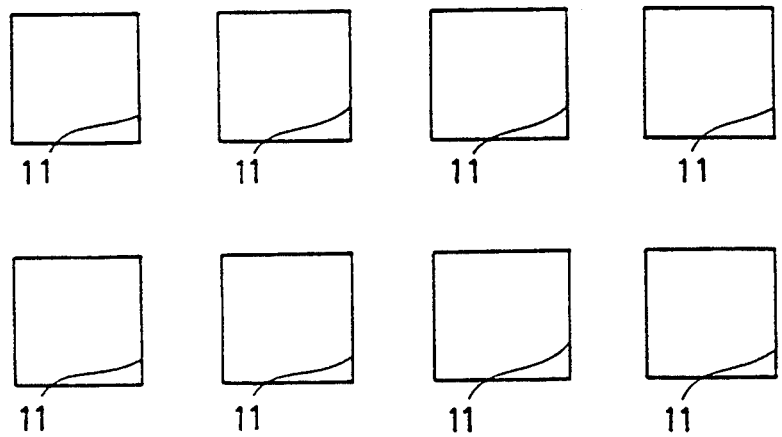
FIG. 4 is a partial plan view showing a plane layout in a first manufacturing step for a flash memory of the invention.

Referring to FIG. 4, a resist pattern formed on a p-type silicon substrate is masked, and trenches 11 are formed on the silicon substrate. Each trench 11 has a depth determined in accordance with a channel length of each memory transistor.

Figure 5:
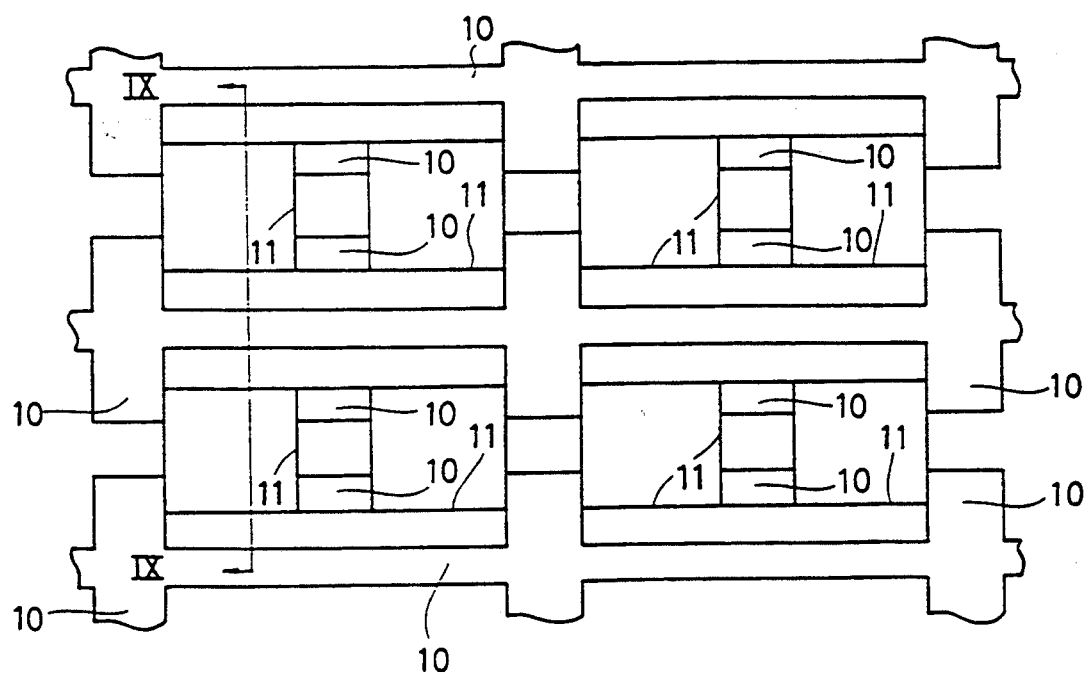
FIG. 5 is a partial plan view showing a plane layout in a second manufacturing step for an EEPROM of the invention.
Figure 9:
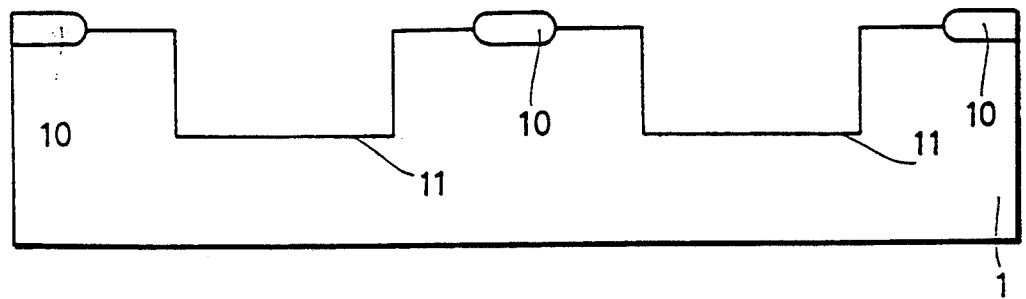
FIG. 9 is a partial cross section of an EEPROM in a second manufacturing step taken along line XV-XV in FIG. 5.

Referring to FIGS. 5 and 9, field oxide film 10 which isolates memory transistor formation regions from each other is formed on p-type silicon substrate 1, using a LOCOS method.

Figure 10:
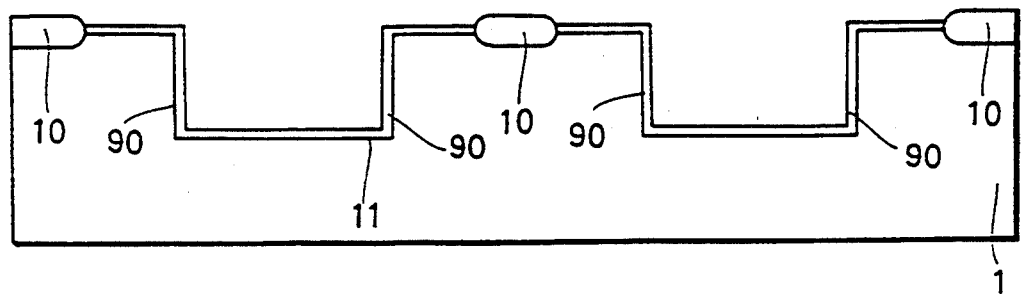
FIG. 10 is a partial cross section of an EEPROM in a third manufacturing step.

Referring to FIG. 10, thermal oxidation is applied to the surface of p-type silicon substrate 1 to form a thermally oxidized film 90 having a thickness of about 200Å.

Figure 11:
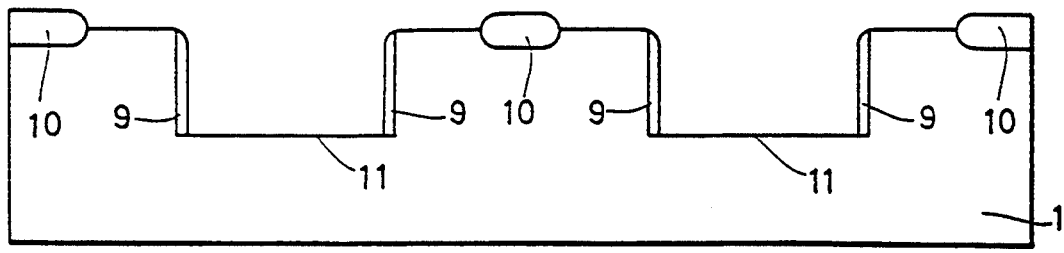
FIG. 11 is a partial cross section of an EEPROM in a fourth manufacturing step.

As shown in FIG. 11, anisotropic dry etching is applied to thermally oxidized film 90, so that oxide films 9 which form first gate oxide films remain on the side walls of trenches 11.

Figure 12:
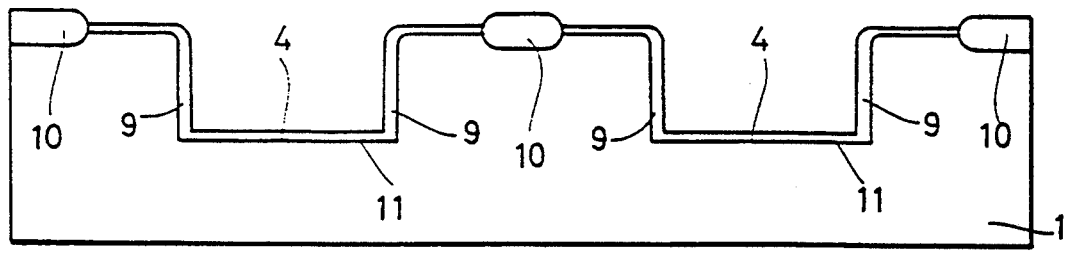
FIG. 12 is a partial cross section of an EEPROM in a fifth manufacturing step.

Referring to FIG. 12, thermal oxidation is applied to the whole surface of silicon substrate 1, so that second gate oxide films 4 having a thickness of about 100Å are formed on the bottom walls of trenches 11. In this processing, first gate oxide films 9 having a thickness of about 300Å are formed on the side walls of trenches 11.

Figure 13:
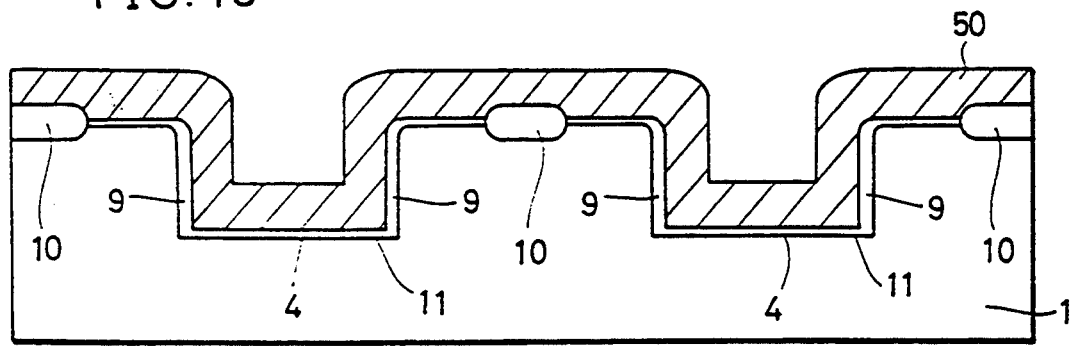
FIG. 13 is a partial cross section of an EEPROM in a sixth manufacturing step.

Referring to FIG. 13, a polysilicon layer 50 having a thickness of about 2000Å is formed on the whole surface of silicon substrate 1, using a CVD method. Impurity of n-type such as phosphorus or arsenic is implanted into polysilicon layer 50 by thermal diffusion or ion implantation.

Figure 6:
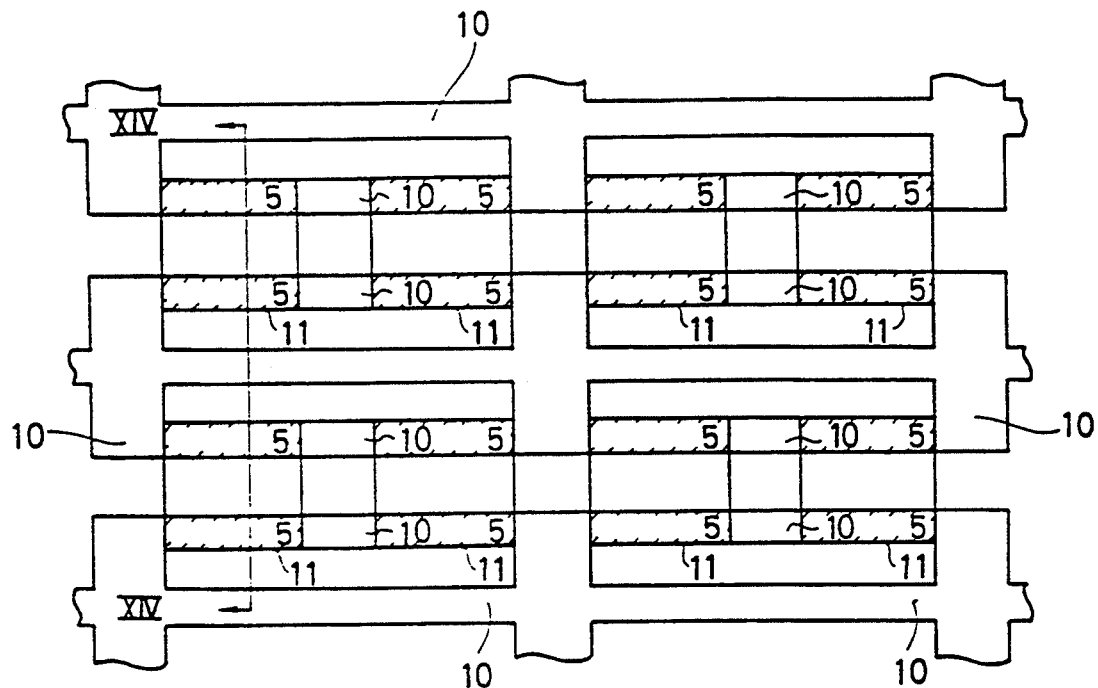
FIG. 6 is a partial plan view showing a plane layout in a seventh manufacturing step for an EEPROM of the invention.
Figure 14:
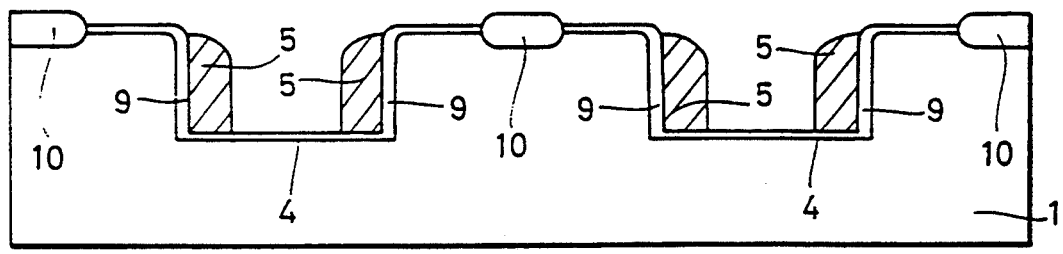
FIG. 14 is a partial cross section of an EEPROM in a seventh manufacturing step taken along line XIV-XIV in FIG. 6.

Referring to FIGS. 6 and 14, anisotropic dry etching is applied to polysilicon layer 50, so that polysilicon layer 50 remains only on the side walls of trenches 11 to form floating gate electrodes 5.

Figure 15:
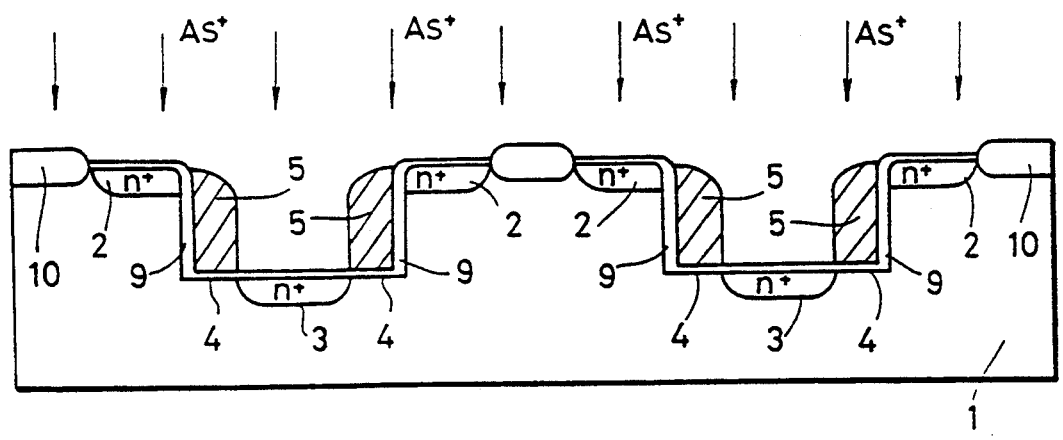
FIG. 15 is a partial cross section of an EEPROM in an eighth manufacturing step.

Referring to FIG. 15, arsenic ion ($As^{30}$) is implanted into silicon substrate 1 at an implantation rate of about $4 \times 10^{15}$ cm$^{-2}$ and an acceleration voltage of about 50 KeV. Thereby, n+-drain diffusion region 2 and n+-source diffusion region 3 are formed.

Figure 16:
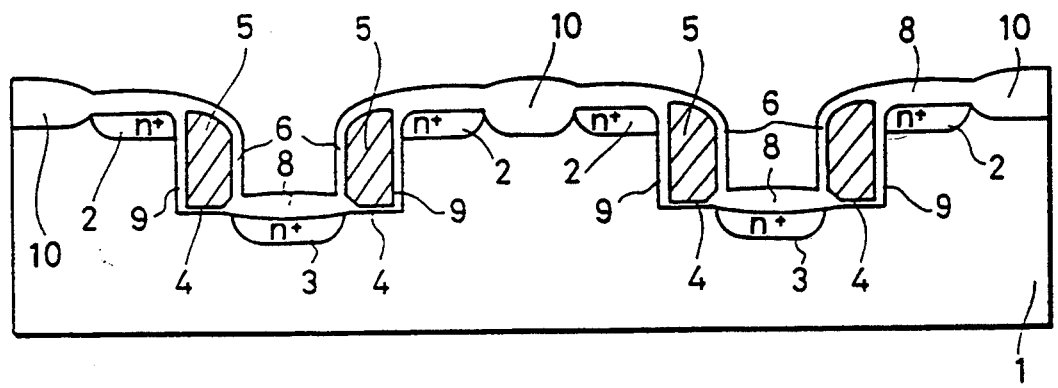
FIG. 16 is a partial cross section of an EEPROM in a ninth manufacturing step.

Referring to FIG. 16, a thermal processing at a temperature of about 900° C. is applied to activate the ion-implanted layers, and then thermal oxidation is applied at the temperature of 900° C. to form the thermally oxidized film, i.e., layer insulating film 6 on floating gate electrodes 5. In this processing, thermally oxidized film 8 having a relatively large thickness are formed on the ion-implanted layers, i.e., n+-drain diffusion regions 2 and n+-source diffusion regions 3 owing to speed-increased oxidation.

Figure 7:
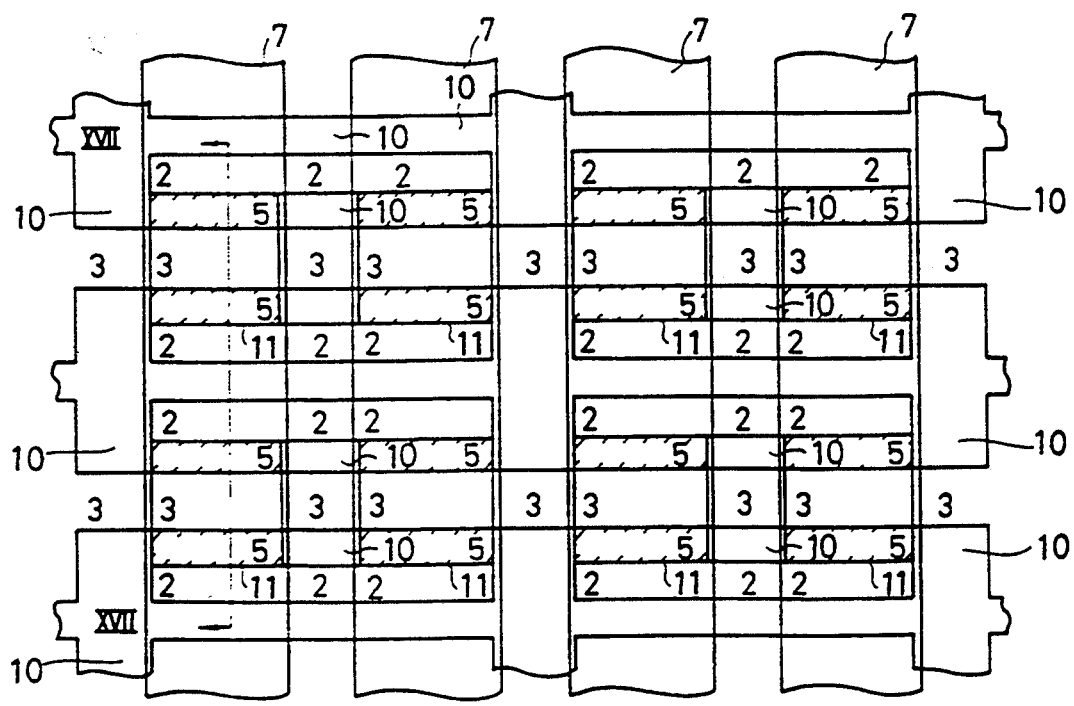
FIG. 7 is a partial plan view showing a plane layout in a tenth manufacturing step for an EEPROM of the invention.
Figure 17:
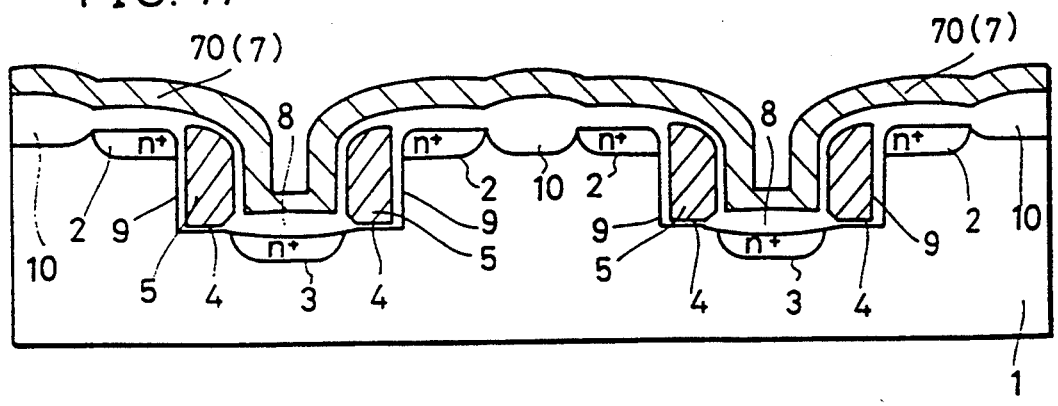
FIG. 17 is a partial cross section of an EEPROM in a tenth manufacturing step taken along line XVII-XVII in FIG. 7.

As shown in FIG. 17, a polysilicon layer 70 having a thickness of about 3000Å is formed on the whole surface of silicon substrate 1. Appropriate processing such as thermal diffusion or ion implantation is used to implant impurity such as phosphorus or arsenic into polysilicon layer 70. Polysilicon layer 70 is selectively removed, using photolithography and anisotropic dry etching to form control gate electrodes 7, as shown in FIG. 7.

Figure 8:
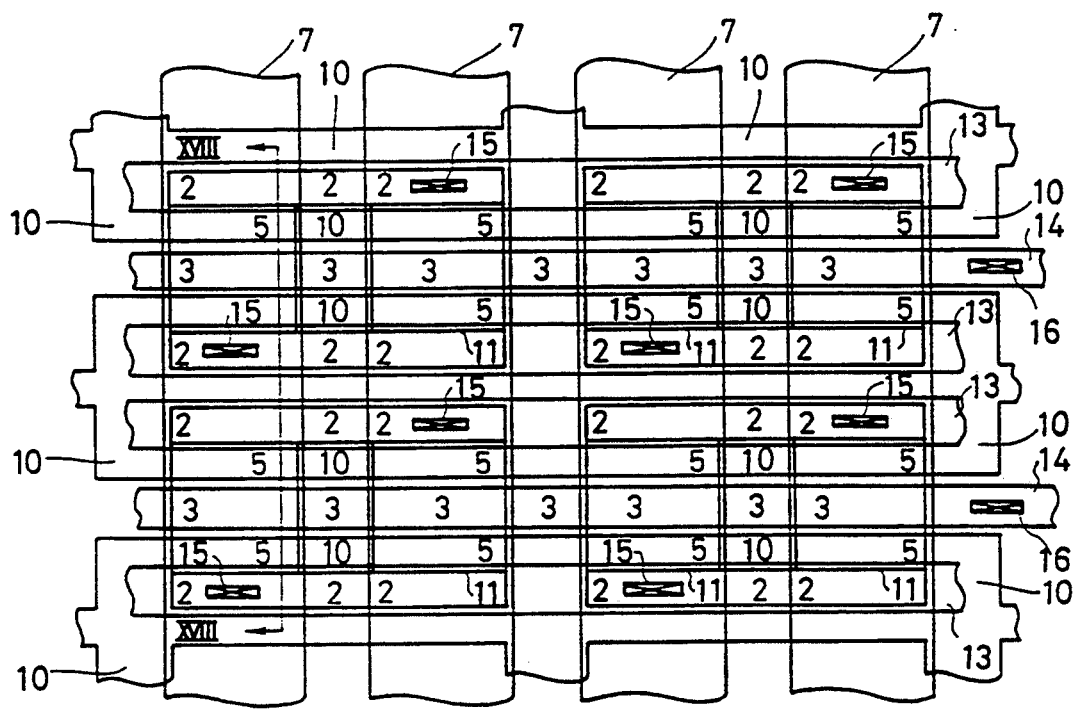
FIG. 8 is a partial plan view showing a plane layout in an eleventh manufacturing step for an EEPROM of the invention.
Figure 18:
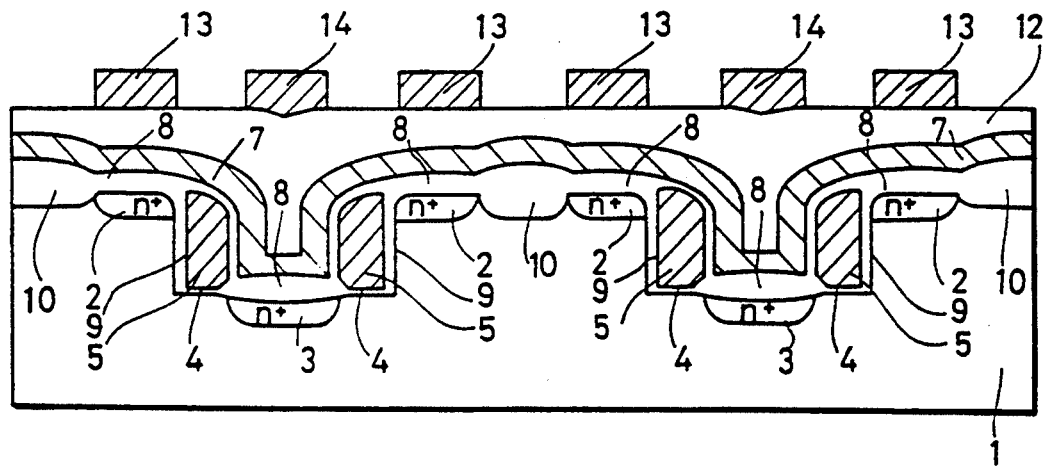
FIG. 18 is a partial cross section of an EEPROM in an eleventh manufacturing step taken along line XVIII-XVIII in FIG. 8.
Figure 19:
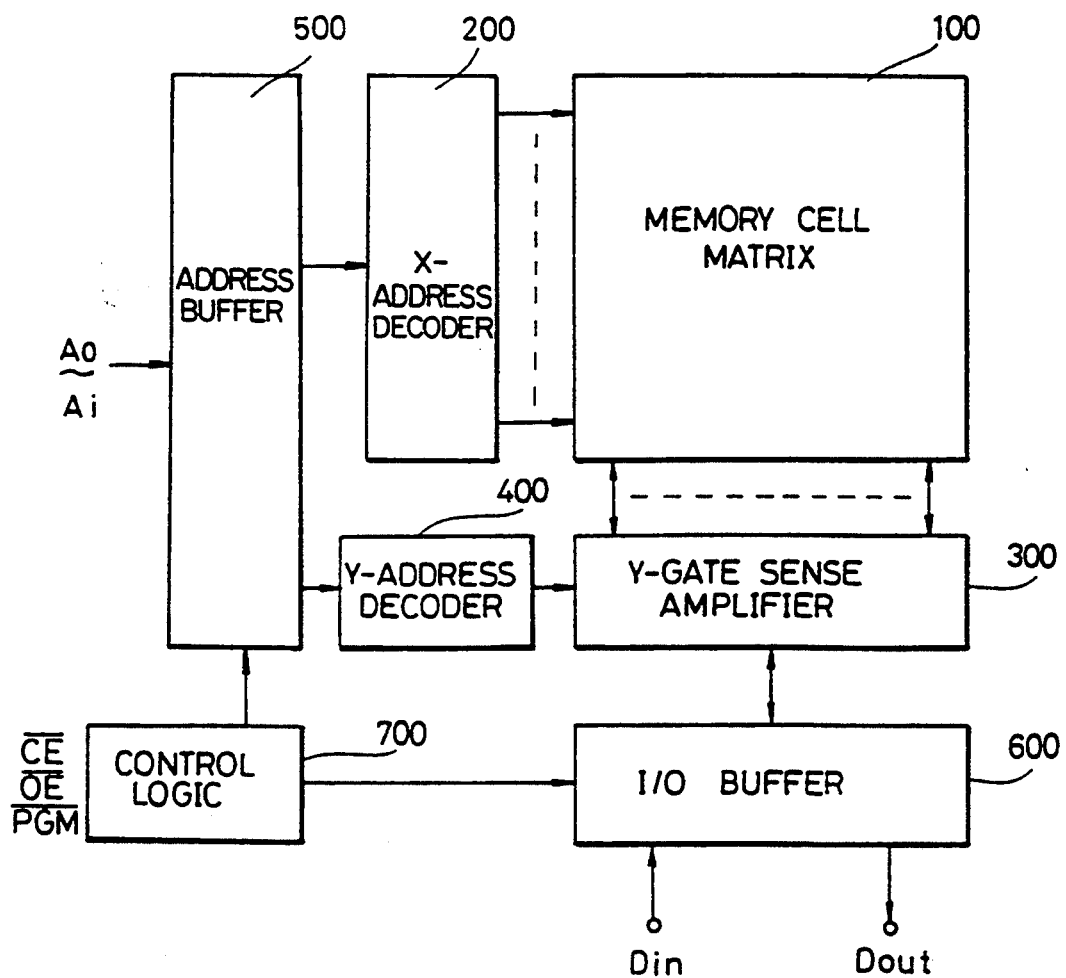
FIG. 19 is a block diagram showing a general construction of a conventional flash memory.

Referring to FIG. 18, smooth coating film 12 such as a thermally oxidized film is formed on the whole surface of the silicon substrate 1 by a CVD method. Then, as shown in FIG. 8, contact holes 15 and 16 are formed at desired positions in smooth coating film 12. Bit lines 13 and source lines 14 formed of aluminum layers are formed to be electrically connected to n+-drain diffusion regions 2 and n+-source diffusion regions 3 through contact holes 15 and 16, respectively. In this manner, the flash memory of the invention is manufactured.

In the manufacturing method of the invention, as shown in FIGS. 10-12, thicknesses of gate oxide films formed under the floating gate electrodes 5 can be varied depending on positions without using a photolithography technique. Therefore, there is no deviation of the areas occupied by first and second gate oxide films 9 and 4 having different thicknesses, which may be caused by mask misalignment. Accordingly, the thicknesses of the gate oxide films under the floating gate electrodes can be easily varied in self alignment.

According to the invention, as described hereinabove, since the electrically erasable and programmable semiconductor memory device has thin insulating films which are formed only at essential positions, the writing efficiency can be increased. Further, since the formation regions for the insulating films having the controlled thin thickness are reduced, the reliability with respect to quality control can be improved.

Further, according to the invention, since the memory transistors are formed inside the trenches, the areas of the semiconductor substrate can be reduced, and thus the dimensions of the semiconductor memory device can be reduced.

According to the manufacturing method of the invention, the thickness of the insulating film under the first gate electrode can be varied depending on the drain side and the source side without using the photolithography technique.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrically erasable and programmable semiconductor memory device comprising a semiconductor substrate of a first conductivity type having a main surface and parallel trenches defined by lateral sidewalls and floors, and a plurality of pairs of memory cells formed in respective sidewalls of said trenches, said pairs of memory cells spaced and isolated from each other by an isolating and insulating film formed on said main surface of said semiconductor substrate, said device including a control gate layer extending between and into said trenches, each of said plurality of memory cells comprising:
a floating gate electrode including an upper portion formed on a respective sidewall of a trench with a first insulating film having a first thickness interposed therebetween, and a lower portion formed on floor of said trench with a second insulating film having a second thickness smaller than said first thickness interposed therebetween;
a first impurity region of a second conductivity type formed in said main surface of said semiconductor substrate adjacent to said respective sidewall of said respective trench and said upper portion of said floating gate electrode;
a second impurity region of said second conductivity formed in common to pairs of said memory cells in said floor of said trench between said lower portions of said floating gate electrodes of each pair of memory cells; and
a gate electrode formed on said floating gate electrode with a third insulating film interposed therebetween.

2. A semiconductor memory device according to claim 1, wherein said gate electrode and said second impurity region are shared by two adjacent memory cells, and two floating gate electrodes of said two adjacent memory cells are opposed to each other and are formed on sidewalls of said trench, interposing said second impurity region formed on said floor of said trench.

3. An electrically erasable and programmable semiconductor memory device comprising:
a semiconductor substrate of a first conductivity type, having a main surface and trenches defined by side walls and bottom walls;
a plurality of memory cells arranged in a matrix form of m rows and n columns, each of said m rows including adjacent pairs of memory cells with the adjacent pairs being isolated from each other by an isolating and insulating form formed on said main surface of said semiconductor substrate;
m number of word lines associated with the memory cells in each row;
n number of bit lines associated with the memory cells in each column; and
a plurality of source lines associated with the memory cells in each column, each of said memory cells comprising:
a first gate electrode including a first portion and a second portion, said first portion being formed on a side wall of a trench with a first insulating film having a first thickness interposed therebetween, and said second portion being formed on a bottom wall of said trench with a second insulating film having a second thickness smaller than said first thickness interposed therebetween;

a first impurity region of a second conductivity type formed at a portion of said main surface of said semiconductor substrate adjacent to said side wall of said trench and located at the vicinity of said first portion of said first gate electrode;

a second impurity region of a second conductivity type formed on said bottom wall of said trench and located at the vicinity of said second portion of said first gate electrode; and a second gate electrode formed on said first gate electrode with a third insulating film interposed therebetween, said first impurity region, said second impurity region and said second gate electrode being connected to a bit line, a source line and a word line, respectively.

4. A semiconductor memory device according to claim 3, wherein said word line includes a conductive layer formed integrally with said second gate electrodes and extending in the row direction so as to interconnect said second gate electrodes.

5. A semiconductor memory device according to claim 3, wherein said source line includes a conductive layer extending in the column direction and connected to said second impurity region extending in the column direction.

6. A semiconductor memory device according to claim 3, wherein said bit line includes a conductive layer extending in the column direction to interconnect said first impurity regions.

7. A semiconductor memory device according to claim 3, wherein said word line is arranged perpendicular to said source line and said bit line.

* * * * *